(12) United States Patent
Warashina et al.

(10) Patent No.: US 7,977,848 B2
(45) Date of Patent: Jul. 12, 2011

(54) PLANAR SURFACE ACOUSTIC WAVE DEVICE, COMMUNICATION MODULE, AND COMMUNICATION APPARATUS

(75) Inventors: Suguru Warashina, Kawasaki (JP); Takashi Matsuda, Kawasaki (JP); Shogo Inoue, Kawasaki (JP); Yoshio Satoh, Kawasaki (JP)

(73) Assignee: Taiyo Yuden Co., Ltd., Tokyo (JP)

( * ) Notice: Subject to any disclaimer, the term of this patent is extended or adjusted under 35 U.S.C. 154(b) by 0 days.

(21) Appl. No.: 12/711,753

(22) Filed: Feb. 24, 2010

(65) Prior Publication Data

US 2010/0148626 A1 Jun. 17, 2010

Related U.S. Application Data

(63) Continuation of application No. PCT/JP2007/074221, filed on Dec. 17, 2007.

(51) Int. Cl.
*H01L 41/08* (2006.01)
*H01L 23/00* (2006.01)
*H03H 9/25* (2006.01)

(52) U.S. Cl. .................................. 310/313 R
(58) Field of Classification Search ............. 310/313 R
See application file for complete search history.

(56) References Cited

U.S. PATENT DOCUMENTS

| | | | |
|---|---|---|---|
| 7,135,805 B2 * | 11/2006 | Yamanouchi | 310/313 D |
| 7,453,184 B2 * | 11/2008 | Kando | 310/313 R |
| 7,705,515 B2 * | 4/2010 | Nishiyama et al. | 310/313 A |
| 2006/0175928 A1 * | 8/2006 | Kando | 310/311 |
| 2007/0096592 A1 | 5/2007 | Kadota et al. | |
| 2007/0107516 A1 * | 5/2007 | Fujimoto et al. | 73/579 |
| 2009/0009028 A1 | 1/2009 | Nishiyama et al. | |
| 2009/0058225 A1 | 3/2009 | Kadota | |
| 2009/0272193 A1 * | 11/2009 | Okaguchi et al. | 73/657 |

FOREIGN PATENT DOCUMENTS

| | | |
|---|---|---|
| JP | 61 136312 U | 8/1986 |
| JP | 6-291596 A | 10/1994 |
| JP | 7-254835 A | 10/1995 |
| JP | 11-186866 A | 7/1999 |
| JP | 2005-150787 A | 6/2005 |
| JP | 2006-238211 A | 9/2006 |
| JP | 3885824 B2 | 2/2007 |
| WO | WO 2005/034347 A1 | 4/2005 |
| WO | WO 2007/125734 A1 | 11/2007 |
| WO | WO 2007/138844 A1 | 12/2007 |

OTHER PUBLICATIONS

Office Action mailed Mar. 21, 2011 in counterpart Korean Application No. 10-2010-7003558.
English Language translation of Office Action mailed Mar. 21, 2011 in counterpart Korean Application No. 10-2010-7003558.

* cited by examiner

*Primary Examiner* — J. SanMartin
(74) *Attorney, Agent, or Firm* — Arent Fox LLP (57) ABSTRACT

An acoustic wave device of the present application includes a piezoelectric substrate (14), interdigital transducer electrodes (13) formed on the piezoelectric substrate (14), and an $SiO_2$ film (12) formed so as to cover the electrodes (13). The acoustic wave device also includes a displacement adjustment film (11) formed on the $SiO_2$ film (12), and the displacement adjustment film (11) is formed from a substance whose acoustic velocity is slower than that of the substance forming the $SiO_2$ film (12). According to this configuration, it is possible to suppress unnecessary waves as well as improve temperature characteristics. Also, by mounting such an acoustic wave device in a communication module or communication apparatus, it is possible to achieve an improvement in reliability.

7 Claims, 13 Drawing Sheets

PLANAR SURFACE ACOUSTIC WAVE DEVICE, COMMUNICATION MODULE, AND COMMUNICATION APPARATUS

CROSS-REFERENCE TO RELATED APPLICATION

This application is based upon and claims the benefit of priority of the prior PCT/JP2007/074221, filed on Dec. 17, 2007, the entire contents of which are incorporated herein by reference.

FIELD

The present application relates to an acoustic wave device, communication module, and communication apparatus.

BACKGROUND

There is demand for both a wide band and favorable temperature characteristics to be satisfied in a duplexer and an RF filter used in a mobile communication system. Conventionally, a piezoelectric substrate configured from 36° to 50° rotated Y-cut X-propagation lithium tantalate (LiTaO$_3$) has been used in a surface acoustic wave apparatus used in a duplexer or an RF filter. The TCF (Temperature coefficient of frequency) of the piezoelectric substrate has been approximately −40 to −30 ppm/° C. Also, in order to improve the temperature characteristics, there is known a method of forming a silicon oxide (SiO$_2$) film having a positive TCF so as to cover the IDT electrodes on the piezoelectric substrate.

On the other hand, with an object other than improving the TCF, Patent Document 1 (Japanese Laid-open Patent Publication No. 11-186866) discloses a manufacturing method for a surface acoustic wave apparatus in which an insulating or semiconductive protective film is formed so as to cover the IDT electrodes of the surface acoustic wave apparatus.

Also, Patent Document 2 (Japanese Laid-open Patent Publication No. 61-136312) discloses a 1 port surface acoustic wave resonator configured by forming an electrode made of a metal such as aluminum or gold on a piezoelectric substrate made of crystal or lithium niobate (LiNbO$_3$), further forming an SiO$_2$ film, and thereafter planarizing the SiO$_2$ film. Planarizing the SiO$_2$ film in this way obtains favorable resonance characteristics.

Also, Patent Document 3 (Japanese Patent No. 3885824) discloses a configuration including a piezoelectric substrate configured from LiNbO$_3$ having an electrical mechanical coupling coefficient (k$^2$) of 0.025 or more; at least one electrode that is formed on the piezoelectric substrate and is made of a metal whose density is greater than that of Al, an alloy whose main component is the metal, or a laminated film configured from either a metal whose density is greater than that of Al or an alloy whose main component is the metal, and another metal; a first insulating layer formed in a region other than a region where the at least one electrode is formed, such that a film thickness of the first insulating layer is approximately equal to that of the electrode; and a second insulating layer formed so as to cover the electrode and the first insulating layer, wherein the density of the electrode is 1.5 or more times that of the first insulating layer, the thickness of the second insulating layer is in the range of 0.18λ to 0.34λ (where λ is the wavelength of the surface waves), and the projection height of a convex portion on the surface of the second insulating layer is 0.03λ or less (where λ is the wavelength of the surface waves). With the configuration disclosed in Patent Document 3, the reflection coefficient of the IDT electrodes is sufficiently large, and the deterioration of characteristics due to ripples appearing in resonance characteristics and the like does not readily occur.

Figure 15:
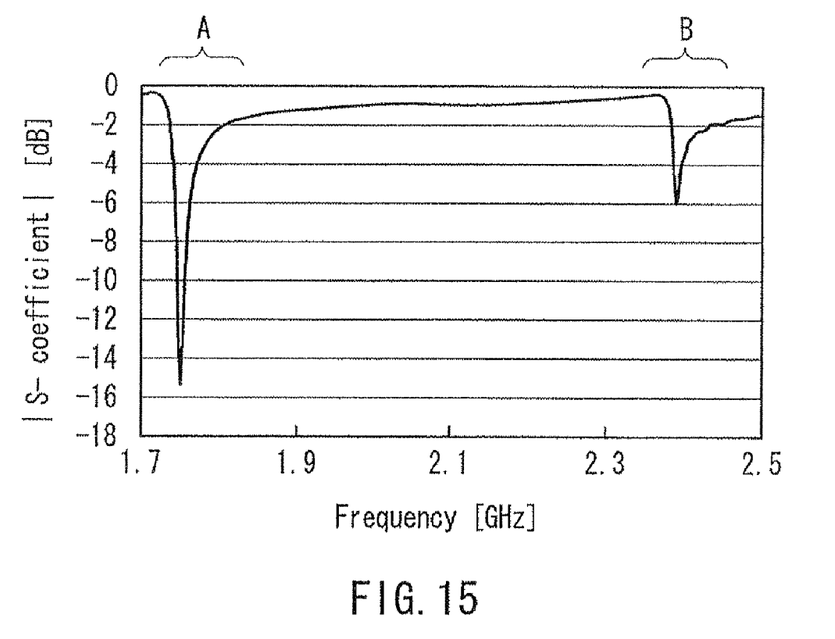
FIG. 15 is a characteristics diagram illustrating frequency response characteristics of a conventional acoustic wave device.
Figure 16:
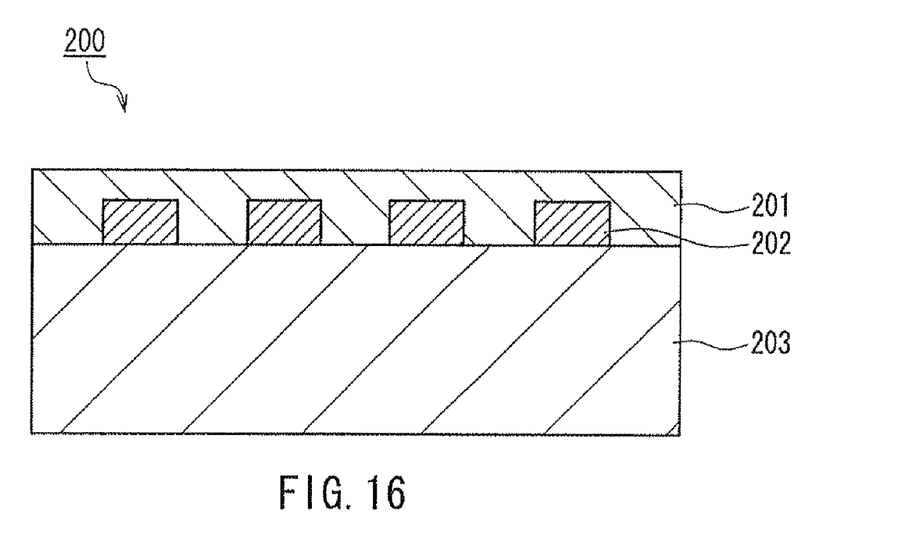
FIG. 16 is a cross-sectional diagram illustrating a configuration of a conventional acoustic wave device.

However, the configurations disclosed in the patent documents have the disadvantage that, as illustrated in FIG. 15, unnecessary waves B appear at a higher frequency than the main response A that is the object in the frequency response of the absolute value of the admittance (S coefficient) of the acoustic wave device. The characteristics illustrated in FIG. 15 are the result of performing a simulation with an FEM (Finite Element Method) using the physical properties illustrated in Table 1 on an acoustic wave device 200 that, as illustrated in FIG. 16, includes IDT electrodes 202 whose period λ is 2 μm on a piezoelectric substrate 203, and furthermore includes an SiO$_2$ film 201 covering the IDT electrodes 202.

TABLE 1

| Physical properties that were used | | | | | |
|---|---|---|---|---|---|
| Substance (unit) | Young's modulus (GPa) | Poisson's ratio (—) | Density (kg/m$^3$) | Velocity (m/sec) | Acoustic impedance (Ns/m$^3$) |
| SiO$_2$ | 70.7 | 0.25 | 2300 | 5544 | 12.8 |
| Au | 78.5 | 0.42 | 19260 | 2019 | 38.9 |
| SiC | 289 | 0.18 | 2920 | 9948 | 29.0 |

As illustrated in FIG. 15, if an unnecessary response (unnecessary waves B) exists, there is the problem that suppression outside the passband degrades when a filter is formed using the acoustic wave device.

Figure 17:
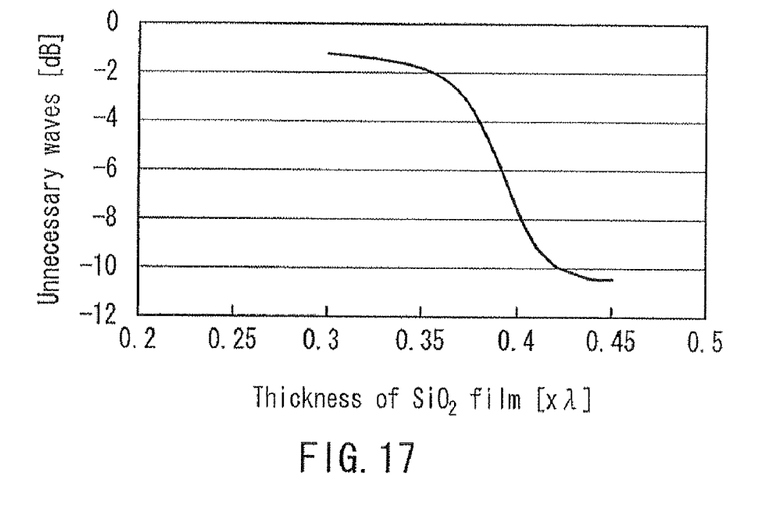
FIG. 17 is a characteristics diagram illustrating a relationship between unnecessary wave size and the film thickness of a $SiO_2$ film.
Figure 18:
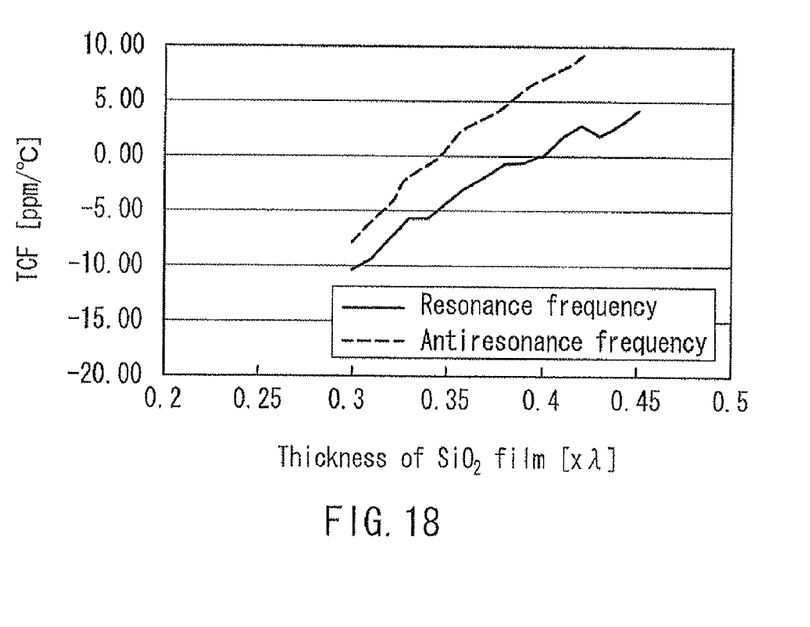
FIG. 18 is a characteristics diagram illustrating a relationship between the film thickness of a $SiO_2$ film and temperature coefficient of frequency.

The relationship between unnecessary wave size and the film thickness of the SiO$_2$ film is illustrated in FIG. 17, and although unnecessary waves can be suppressed by reducing the film thickness of the SiO$_2$ film, there is the problem that, as illustrated in FIG. 18, the temperature characteristics deteriorate if the film thickness of the SiO$_2$ film is reduced. Note that FIG. 18 illustrates the relationship between the film thickness of the SiO$_2$ film and TCF.

SUMMARY

An acoustic wave device of the present application is an acoustic wave device provided with a piezoelectric substrate, interdigital transducer electrodes formed on the piezoelectric substrate, and an insulating layer formed so as to cover the electrodes, the acoustic wave device including: a displacement adjustment film formed on the insulating layer, wherein the displacement adjustment film is formed from a substance whose acoustic velocity is slower than that of a substance forming the insulating layer.

The object and advantages of the invention will be realized and attained by means of the elements and combinations particularly pointed out in the appended claims. It is to be understood that both the foregoing general description and the following detailed description are exemplary and explanatory only and are not restrictive of the invention, as claimed.

DESCRIPTION OF THE EMBODIMENT

A first configuration of an acoustic wave device of the present application is an acoustic wave device provided with a piezoelectric substrate, interdigital transducer electrodes formed on the piezoelectric substrate, and an insulating layer formed so as to cover the electrodes, the acoustic wave device including: a displacement adjustment film formed on the insulating layer, wherein the displacement adjustment film is formed from a substance whose acoustic velocity is slower than that of a substance forming the insulating layer. According to this configuration, it is possible to suppress unnecessary waves as well as improve temperature characteristics.

The acoustic wave device of the present application can take various forms such as the following, based on the configuration described above.

Specifically, in the acoustic wave device of the present application, a configuration is possible in which the electrodes are configured by a metal, an alloy whose main component is the metal, or a laminated film configured from a metal and another metal.

Also, in the acoustic wave device of the present application, a configuration is possible in which the insulating layer is formed from $SiO_2$, and the displacement adjustment film is formed from a single layer made of a substance whose acoustic velocity is slower than that of $SiO_2$, or a laminated film whose main component is any substance from among substances whose acoustic velocity is slower than that of $SiO_2$.

Also, in the acoustic wave device of the present application, a configuration is possible in which the displacement adjustment film is formed from a single layer made of any of Au, Ag, Pt, Ta, Cu, W, Ti, and Ni, or a laminated film whose main component is any substance from among Au, Ag, Pt, Ta, Cu, W, Ti, and Ni.

Also, a second configuration of the acoustic wave device of the present application is an acoustic wave device provided with a piezoelectric substrate, interdigital transducer electrodes formed on the piezoelectric substrate, a first insulating layer formed between the electrodes and so as to have approximately the same film thickness as the electrodes, and a second insulating layer formed so as to cover the electrodes and the first insulating layer, the acoustic wave device including: a displacement adjustment film formed on the second insulating layer, wherein the displacement adjustment film is formed from a substance whose acoustic velocity is slower than that of a substance forming the second insulating layer. According to this configuration, it is possible to suppress unnecessary waves as well as improve temperature characteristics. Also, since a polishing step is unnecessary in manufacturing, the manufacturing is easy and it is possible to reduce the manufacturing cost.

Also, a manufacturing method for an acoustic wave device of the present application is a manufacturing method for an acoustic wave device provided with a piezoelectric substrate, interdigital transducer electrodes formed on the piezoelectric substrate, an insulating layer formed so as to cover the electrodes, and a displacement adjustment film formed on the insulating layer and configured by a substance whose acoustic velocity is slower than that of the insulating layer, the manufacturing method including: forming the electrodes on the piezoelectric substrate; forming the insulating layer on the piezoelectric substrate so as to cover the electrodes; and forming the displacement adjustment film on the insulating layer. According to this method, a polishing step is unnecessary in manufacturing, and therefore the manufacturing is easy and it is possible to reduce the manufacturing cost.

Also, a communication module of the present application includes the acoustic wave device described above.

Also, a communication apparatus of the present application includes the communication module described above.

Embodiment

1. [Configuration of Acoustic Wave Device]

Figure 1:
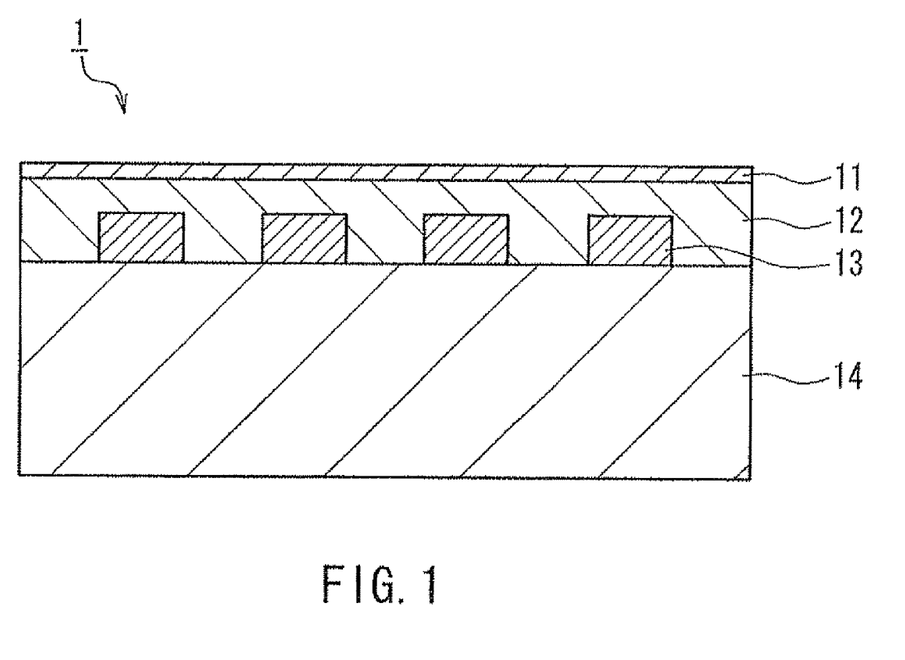
FIG. 1 is a cross-sectional diagram of an acoustic wave device according to an embodiment.

FIG. 1 illustrates a configuration of an acoustic wave device of Embodiment 1. In an acoustic wave device 1 in FIG. 1, IDT electrodes 13 are formed on a piezoelectric substrate 14, and furthermore an $SiO_2$ film 12 is formed so as to cover the IDT electrodes 13. In the present embodiment, a displacement adjustment film 11 is furthermore formed on the $SiO_2$ film 12. The displacement adjustment film 11 is formed from a single-layer film made of a substance whose acoustic velocity is slower than that of the substance forming the $SiO_2$ film 12, or a laminated film whose main component is a substance whose acoustic velocity is slower than that of the substance forming the $SiO_2$ film 12. For example, it is preferable that the displacement adjustment film 11 is formed from a single-layer film made of any of gold (Au), silver (Ag), platinum (Pt), tantalum (Ta), copper (Cu), tungsten (W), titanium (Ti), and nickel (Ni), or a laminated film whose main component is any of the above substances. In particular, Ta and W are preferable since there is little variation in the resonance frequency due to Ta and W having an acoustic velocity close to the acoustic velocity of $SiO_2$. Also, Ti is preferable due to having excellent adhesion to $SiO_2$. Note that the $SiO_2$ film 12 is an example of an insulating layer.

The linear expansion coefficient of a normal substance is positive, and if the acoustic wave device is formed using a common manufacturing method, the TCF of the acoustic wave device is negative, and the characteristics therefore change if the temperature of the device changes. For this reason, $SiO_2$ having a positive TCF is used in combination in order to bring the TCF close to 0. However, if the film thickness of the $SiO_2$ film is increased in order to improve the TCF, there is an increase in the unnecessary wave level as illustrated in the previously described FIG. 18. In other words, there is a trade-off relationship between TCF and unnecessary wave level.

Figure 2A:
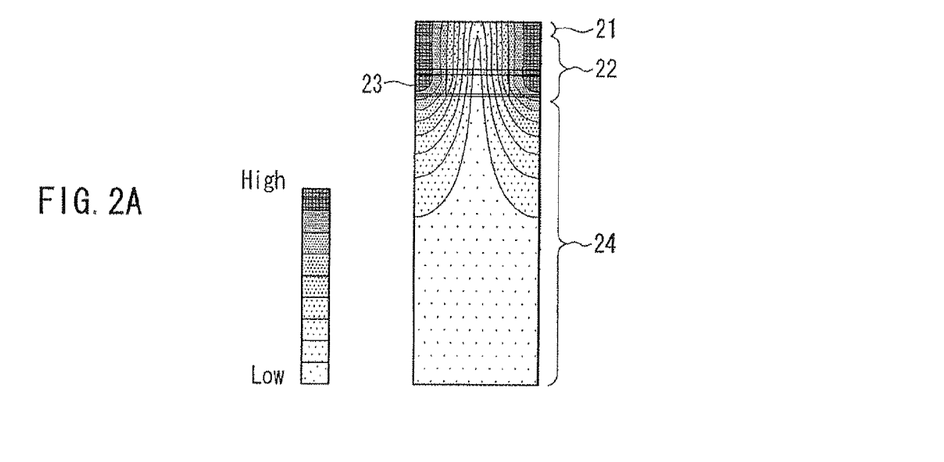
FIG. 2A is a distribution diagram illustrating an energy distribution of a resonance frequency when the film thickness of a displacement adjustment film is 1 nm.
Figure 2B:
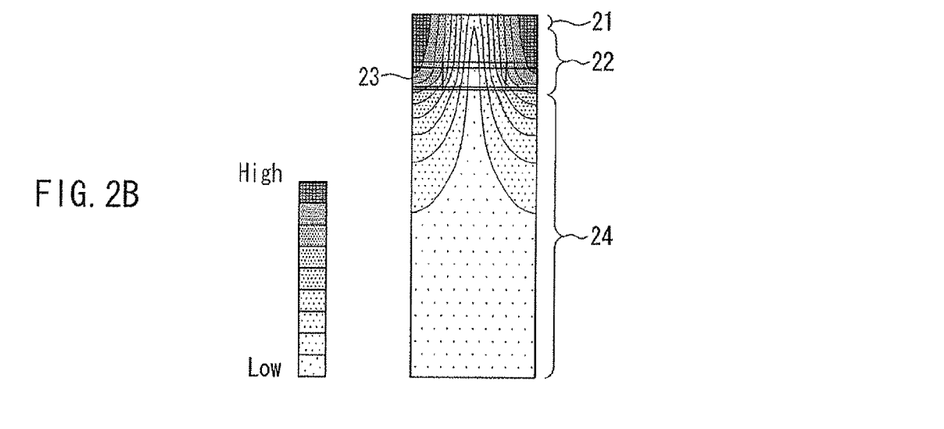
FIG. 2B is a distribution diagram illustrating an energy distribution of an antiresonance frequency when the film thickness of the displacement adjustment film is 1 nm.
Figure 2C:
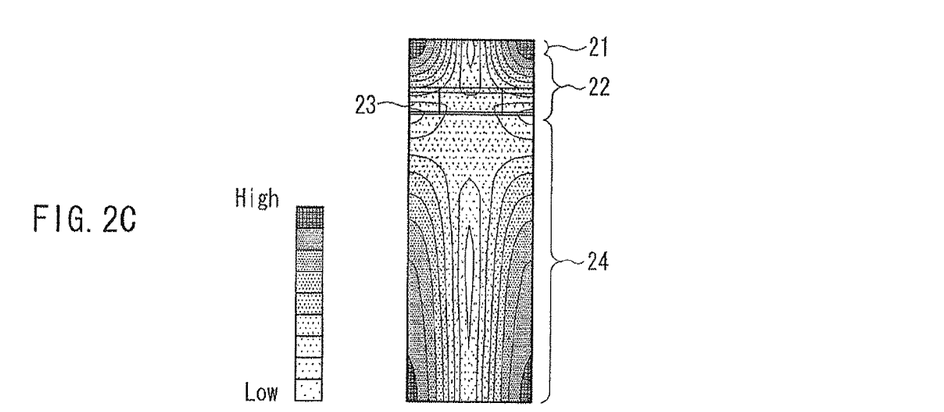
FIG. 2C is a distribution diagram illustrating an energy distribution of unnecessary waves when the film thickness of the displacement adjustment film is 1 nm.
Figure 3A:
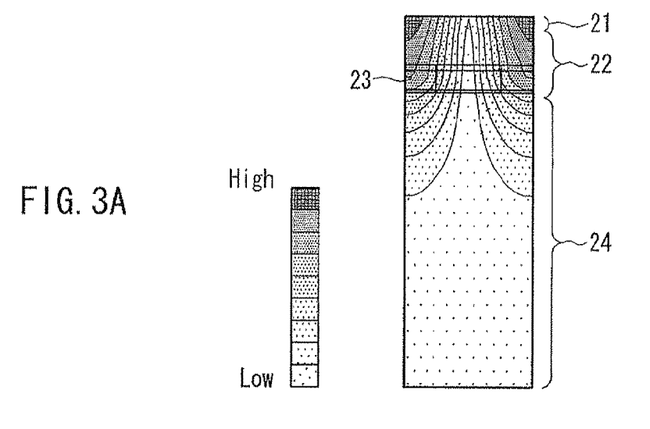
FIG. 3A is a distribution diagram illustrating an energy distribution of a resonance frequency when the film thickness of the displacement adjustment film is 10 nm.
Figure 3B:
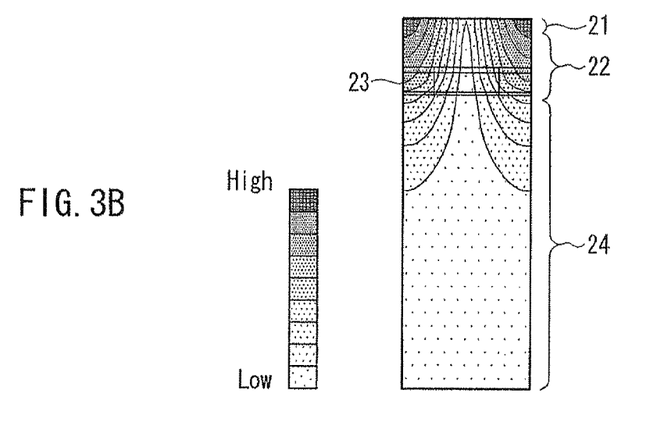
FIG. 3B is a distribution diagram illustrating an energy distribution of an antiresonance frequency when the film thickness of the displacement adjustment film is 10 nm.
Figure 3C:
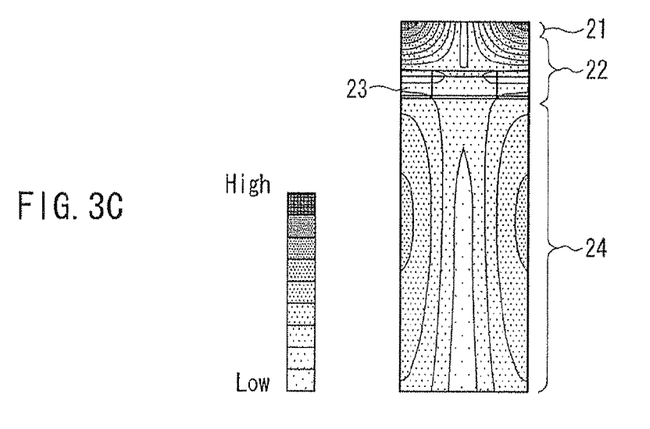
FIG. 3C is a distribution diagram illustrating an energy distribution of unnecessary waves when the film thickness of the displacement adjustment film is 10 nm.
Figure 4A:
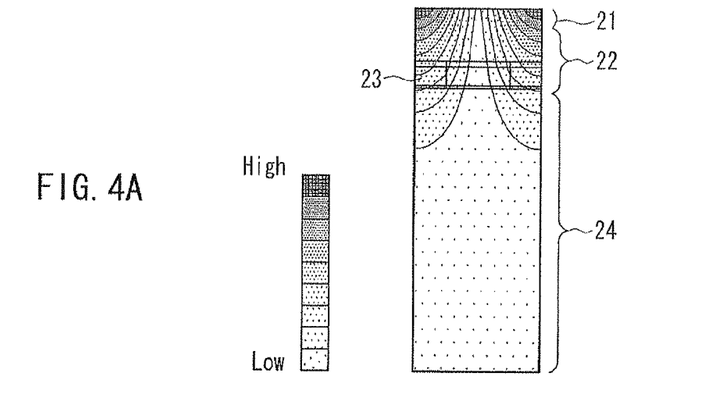
FIG. 4A is a distribution diagram illustrating an energy distribution of a resonance frequency when the film thickness of the displacement adjustment film is 30 nm
Figure 4B:
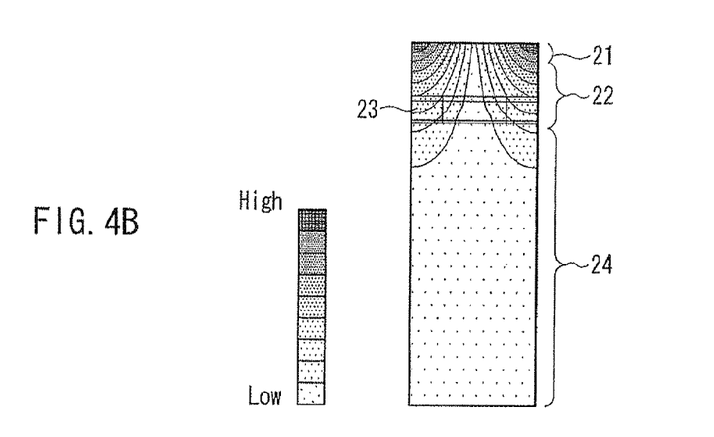
FIG. 4B is a distribution diagram illustrating an energy distribution of an antiresonance frequency when the film thickness of the displacement adjustment film is 30 nm
Figure 4C:
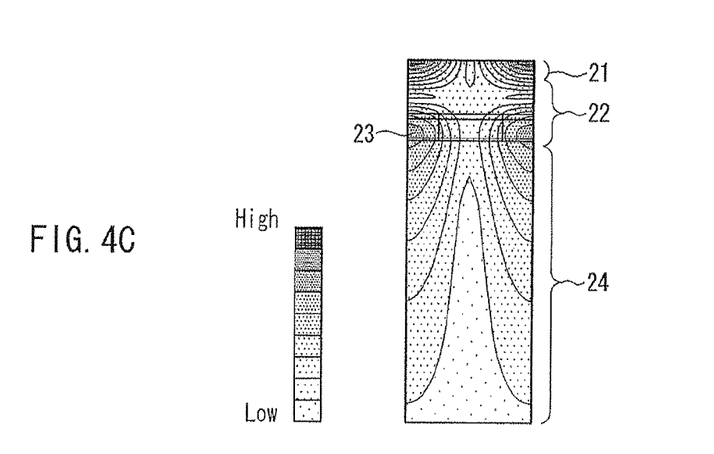
FIG. 4C is a distribution diagram illustrating an energy distribution of unnecessary waves when the film thickness of the displacement adjustment film is 30 nm.

FIG. 2A illustrates an energy distribution of a resonance frequency of the main response when the displacement adjustment film 11 is formed from Au and has a thickness of 1 nm. FIG. 2B illustrates an energy distribution of an antiresonance frequency in the same configuration. FIG. 2C illustrates an energy distribution of a resonance frequency of unnecessary waves in the same configuration. FIGS. 3A to 3C illustrate energy distributions of a resonance frequency of the main response (FIG. 3A), an antiresonance frequency (FIG. 3B), and a resonance frequency of unnecessary waves (FIG. 3C) when the film thickness of the displacement adjustment film 11 is 10 nm. FIGS. 4A to 4C illustrate energy distributions of a resonance frequency of the main response (FIG. 4A), an antiresonance frequency (FIG. 4B), and a resonance frequency of unnecessary waves (FIG. 4C) when the film thickness of the displacement adjustment film 11 is 30 nm. In each of these figures, a region 21 illustrates an energy distribution in the displacement adjustment film 11, a region 22 illustrates an energy distribution in the $SiO_2$ film 12, a region 23 illustrates an energy distribution in the IDT electrodes 13, and a region 24 illustrates an energy distribution in the piezoelectric substrate 14.

Figure 5:
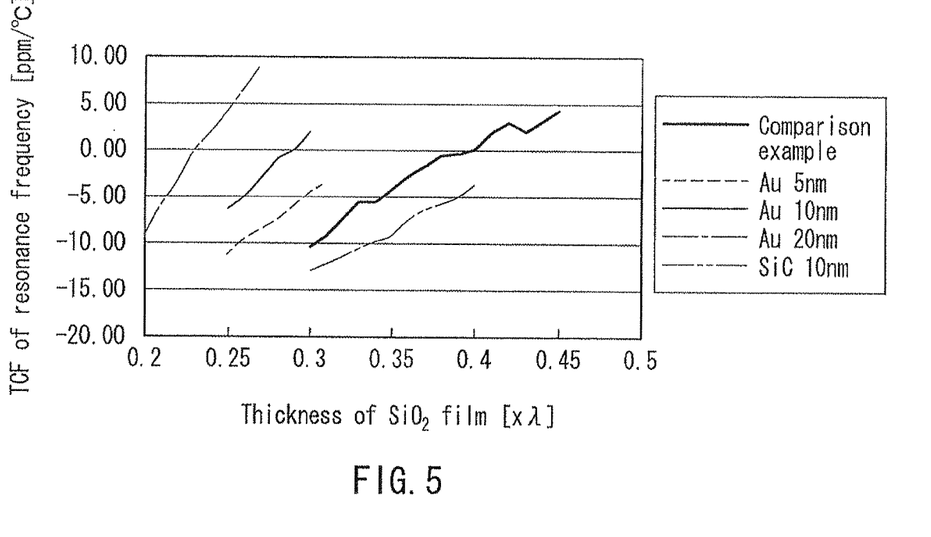
FIG. 5 is a characteristics diagram illustrating a relationship between the film thickness of an $SiO_2$ film and TCF.

As illustrated in FIGS. 2A and 2B, if the displacement adjustment film 11 is thin, the high-energy regions at the resonance frequency of the main response and the antiresonance frequency reach the vicinity of the interface between the region 22 of the $SiO_2$ film 12 and the region 24 of the piezoelectric substrate 14, whereas as illustrated in FIGS. 4A and 4B, if the displacement adjustment film 11 is thick, the high-energy regions at the resonance frequency of the main response and the antiresonance frequency are concentrated at the surface of the acoustic wave device 1 (the region 21 of the displacement adjustment film 11). This is because the acoustic velocity of Au is slower than the acoustic velocity of $SiO_2$. In contrast, if the displacement adjustment film 11 is formed from a substance whose acoustic velocity is faster than the acoustic velocity of $SiO_2$, such as silicon carbide (SiC), the high-energy regions move to the internal side of the piezoelectric substrate 14, the degree of influence of the linear expansion coefficient of the piezoelectric substrate 14 rises, and the TCF deteriorates. When the case where Au having a an thickness of 10 nm is formed and the case where SiC having a film thickness of 10 nm is formed are compared as illustrated in FIG. 5, it can be seen that the TCF is improved when Au is formed. In other words, if the displacement adjustment film 11 is formed from Au, the high-energy regions at the resonance frequency of the main response and the antiresonance frequency are concentrated at the surface of the acoustic wave device 1, and therefore the degree of influence of the linear expansion coefficient of the piezoelectric substrate 14 falls, and the TCF is improved.

Note that FIG. 5 illustrates the relationship between the film thickness of the $SiO_2$ film 12 and TCF in cases in which the displacement adjustment film 11 is formed from Au having a film thickness of 5 nm, Au having a film thickness of 10 nm, Au having a film thickness of 20 nm, SiC having a thickness of 10 nm, and in a case in which the displacement adjustment film 11 is not formed (comparison example). In the graph illustrated in FIG. 5, the horizontal axis is the film thickness of the $SiO_2$ film 12.

Figure 6:
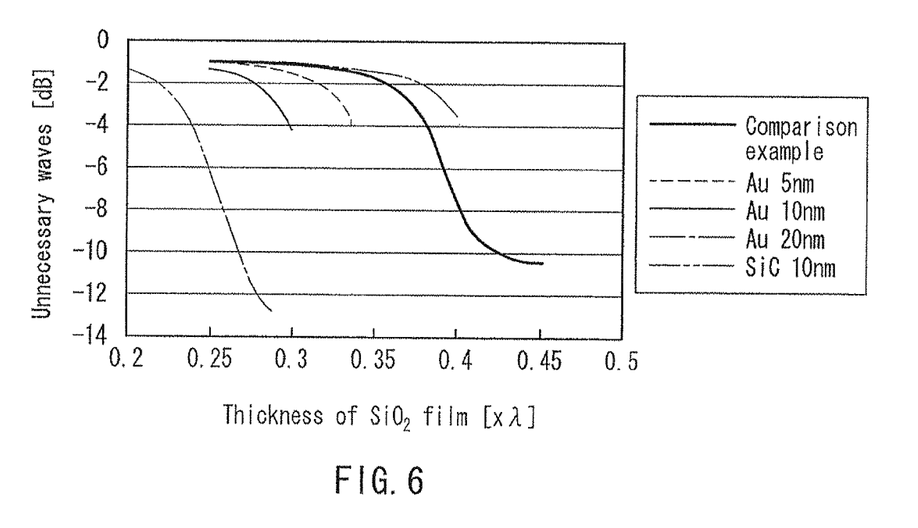
FIG. 6 is a characteristics diagram illustrating a relationship between the film thickness of the $SiO_2$ film and TCF under the conditions of the displacement adjustment film illustrated in FIG. 5.

However, as illustrated in FIG. 6, if the film thickness of the $SiO_2$ film 12 is set the same and unnecessary wave levels are compared, it can be seen that the unnecessary wave level rises due to forming the displacement adjustment film 11 on the $SiO_2$ film 12. This is because the high-energy regions move to the surface of the acoustic wave device 1, and unnecessary waves are readily generated. Note that FIG. 6 illustrates the relationship between the film thickness of the $SiO_2$ film 12 and unnecessary waves under the conditions of the displacement adjustment film 11 illustrated in FIG. 5.

Figure 7:
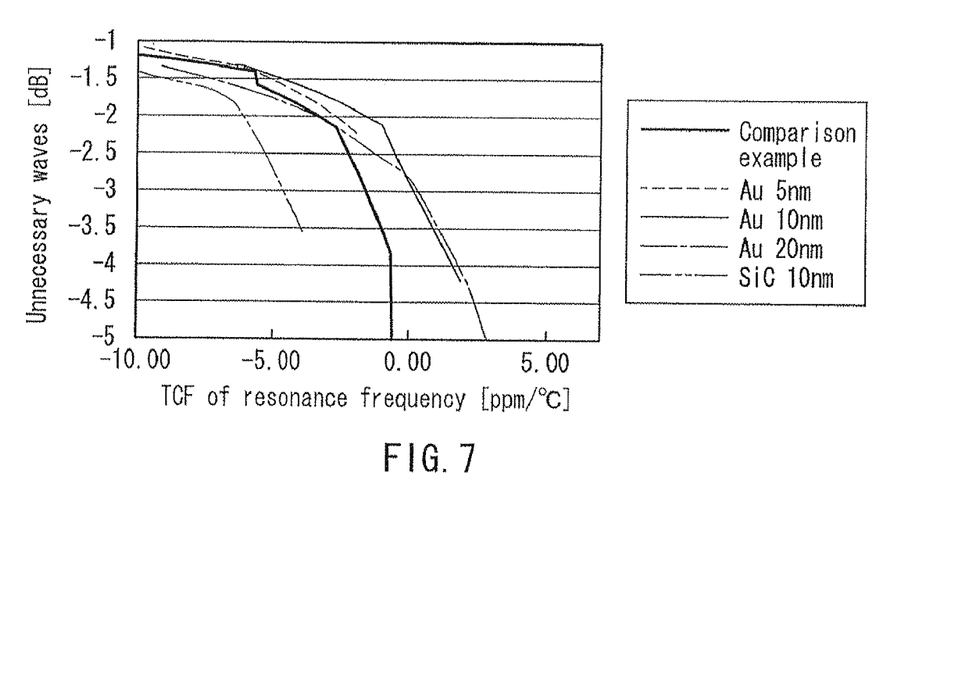
FIG. 7 is a characteristics diagram illustrating a relationship between resonance frequency TCF and unnecessary wave levels under the conditions of the displacement adjustment film illustrated in FIG. 5.
Figure 8:
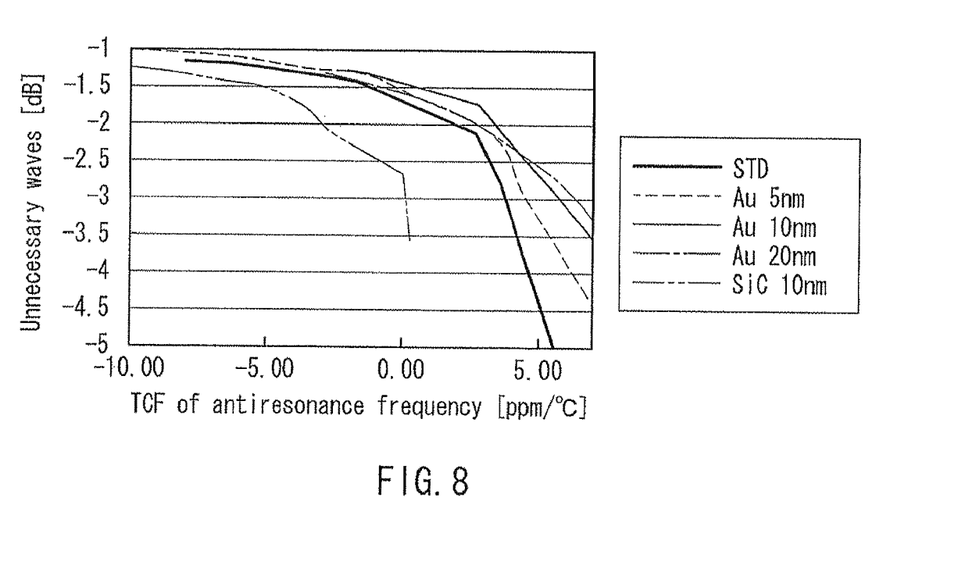
FIG. 8 is a characteristics diagram illustrating a relationship between antiresonance frequency TCF and unnecessary wave levels under the conditions of the displacement adjustment film illustrated in FIG. 5.

However, as illustrated in FIGS. 7 and 8, if the TCF is set the same and a comparison is performed, it can be seen that there is an improvement with respect to unnecessary waves since the film thickness of the $SiO_2$ film 12 can be reduced. In the illustrated examples, the closer the TCF is to zero, the better, and therefore a configuration in which Au having a film thickness of 10 nm is formed is the best. Note that FIG. 7 illustrates the relationship between resonance frequency TCF and unnecessary wave levels under the conditions of the displacement adjustment film 11 illustrated in FIG. 5. Also, FIG. 8 illustrates the relationship between antiresonance frequency TCF and unnecessary wave levels under the conditions of the displacement adjustment film 11 illustrated in FIG. 5.

Figure 9:
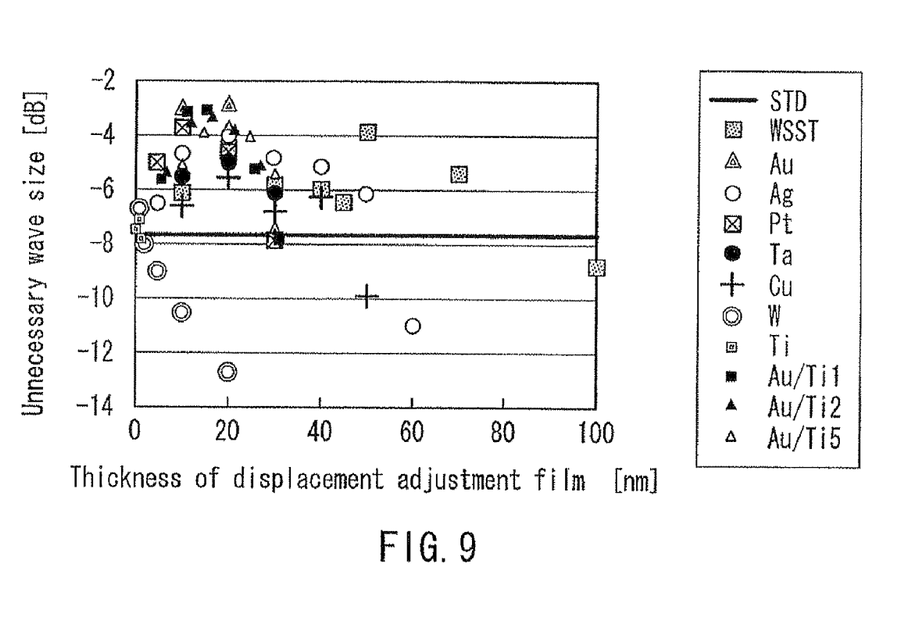
FIG. 9 is a characteristics diagram illustrating a relationship between the film thickness of the displacement adjustment film and unnecessary wave size in cases in which the displacement adjustment film has been formed from various substances.
Figure 10:
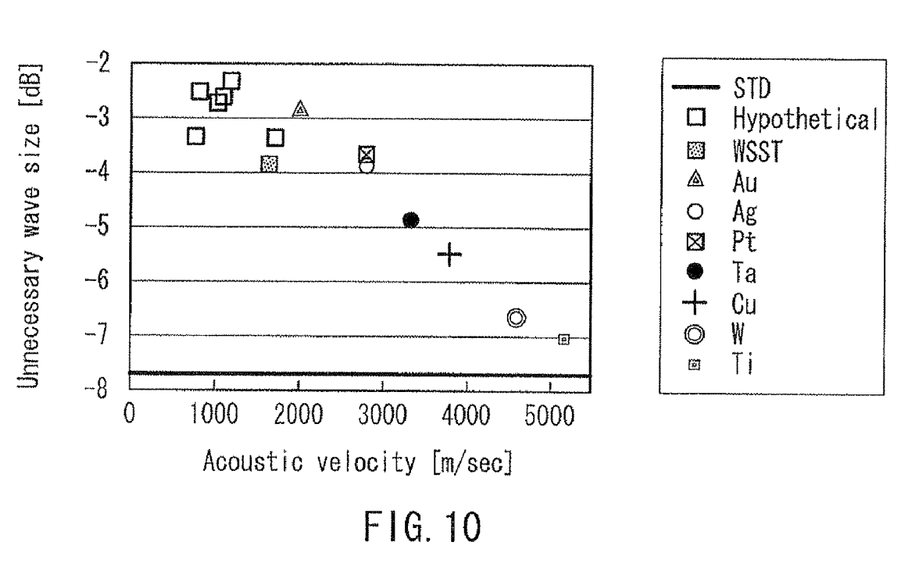
FIG. 10 is a characteristics diagram illustrating a relationship between the acoustic velocity of the displacement adjustment film and unnecessary wave size in cases in which the displacement adjustment film has been formed from various substances.
Figure 11:
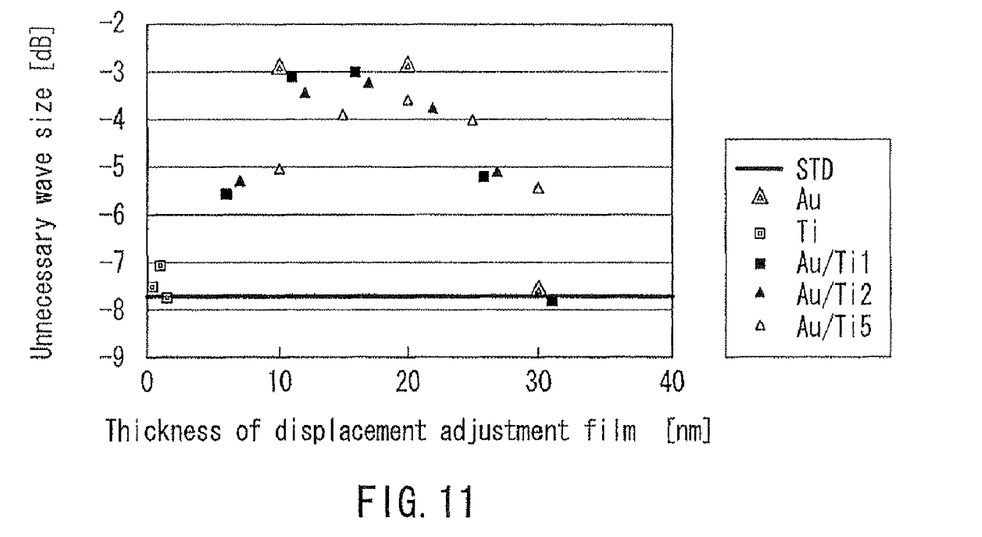
FIG. 11 is a characteristics diagram illustrating a relationship between the film thickness of the displacement adjustment film and unnecessary wave size in cases in which the displacement adjustment film has been formed from various substances.

Also, the film thickness of the displacement adjustment film 11 was set to 10 nm, the Young's modulus and density of the displacement adjustment film were changed according to the conditions illustrated in Table 2, and the size of the unnecessary waves was measured in each case. FIGS. 9 to 11 illustrate a distribution of the size of the unnecessary waves when the resonance frequency TCF was 0 ppm/° C., and it can be seen that the slower the acoustic velocity of the substance forming the displacement adjustment film 11, the more unnecessary waves are suppressed. Also, it can be seen that the film thickness of the displacement adjustment film 11 has an optimum value.

TABLE 2

Physical properties that were used

| Substance (unit) | Young's modulus (GPa) | Poisson's ratio (—) | Density (kg/m³) | Velocity (m/sec) | Acoustic impedance (Ns/m³) |
|---|---|---|---|---|---|
| $SiO_2$ TEOS 400 measured value | 70.7 | 0.25 | 2300 | 5544 | 12.8 |
| WSST resist | 3 | 0.3 | 1100 | 1651 | 1.8 |
| Au | 78.5 | 0.42 | 19260 | 2019 | 38.9 |
| Cu | 129.8 | 0.343 | 8960 | 3806 | 34.1 |
| Ti | 120.2 | 0.321 | 4500 | 5168 | 23.3 |
| Ag | 82.7 | 0.38 | 10490 | 2808 | 29.5 |
| Pt | 170 | 0.303 | 21450 | 2815 | 60.4 |
| Ta | 185.7 | 0.33 | 16600 | 3345 | 55.5 |
| W | 411 | 0.33 | 19300 | 4615 | 89.1 |
| SiC | 289 | 0.18 | 2920 | 9948 | 29.0 |
| Ni | 199.5 | 0.336 | 8900 | 4735 | |

Note that FIGS. 9 and 11 illustrate the relationship between the film thickness of the displacement adjustment film 11 and unnecessary wave size in cases in which the displacement adjustment film 11 is formed from various substances. FIG. 10 illustrates the relationship between the acoustic velocity of the displacement adjustment film 11 and unnecessary wave size in cases in which the displacement adjustment film 11 is formed from various substances. The substances used in the measurements producing the measurement results illustrated in FIGS. 9 and 10 were WSST resist, gold (Au), silver (Ag), platinum (Pt), tantalum (Ta), copper (Cu), tungsten (W), and titanium (Ti). In the measurements producing the measurement results illustrated in FIG. 9, measurements were performed for laminated films including Au and adhesion layers (Ti1, Ti2, and Ti3), in addition to the above substances. Also, the substances used in the measurements producing the measurement results illustrated in FIG. 11 were Au, Ti, and laminated films including Au and Ti. Also, measurements were performed for nickel (Ni) as well, and it was confirmed that the acoustic velocity was slower than that of $SiO_2$ as illustrated in Table 2 (not plotted in FIGS. 9 and 11).

As described above, due to forming the displacement adjustment film 11 whose acoustic velocity is slower than the acoustic velocity of the $SiO_2$ film 12 on the $SiO_2$ film 12, energy is concentrated at the surface of the acoustic wave device 1. Accordingly, the influence of the linear expansion coefficient of the piezoelectric substrate 14 decreases, and the TCF can be improved. Also, the generation of unnecessary waves can be suppressed since the thickness of the $SiO_2$ film 12 can be reduced.

Note that although the $SiO_2$ film 12 is a single-layer film in the present embodiment, the same effects can be obtained even if the $SiO_2$ film 12 has a laminated structure including a first insulating layer (e.g., an $SiO_2$ film) formed so as to have approximately the same film thickness as the IDT electrodes 13, and a second insulating layer (e.g., the same $SiO_2$ film as the first insulating layer) formed so as to cover the first insulating layer. This configuration eliminates the need for a polishing step in manufacturing, thereby enabling a reduction in manufacturing cost.

2. [Manufacturing Method for Acoustic Wave Device]

FIGS. 12A to 12F are cross-sectional diagrams illustrating manufacturing steps for the acoustic wave device of the present embodiment. The displacement adjustment film 11 used in the manufacturing steps illustrated in FIGS. 12A to 12F is a laminated film including Au and Ti.

Figure 12A:
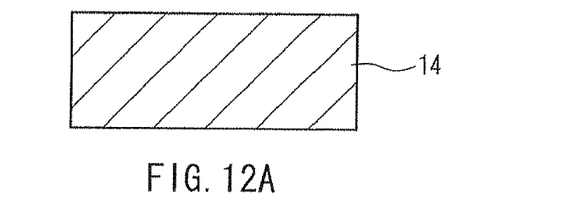
FIG. 12A is a cross-sectional diagram for describing a manufacturing step for the acoustic wave device of the embodiment.

First, the piezoelectric substrate 14 illustrated in FIG. 12A is prepared.

Figure 12B:
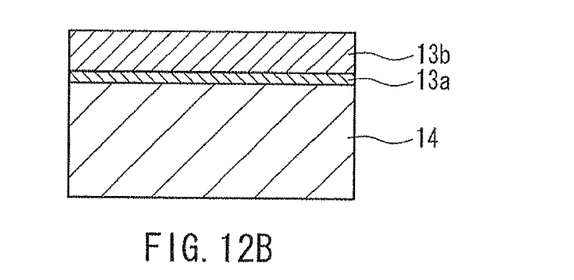
FIG. 12B is a cross-sectional diagram for describing a manufacturing step for the acoustic wave device of the embodiment.

Next, as illustrated in FIG. 12B, a Ti film 13a that is an adhesion layer is formed on the surface of the piezoelectric substrate 14, and a Cu film 13b is formed on the Ti film 13a. Note that in the present embodiment, the film thickness of the Ti film 13a is 20 nm, and the film thickness of the Cu film 13b is 100 nm.

Figure 12C:
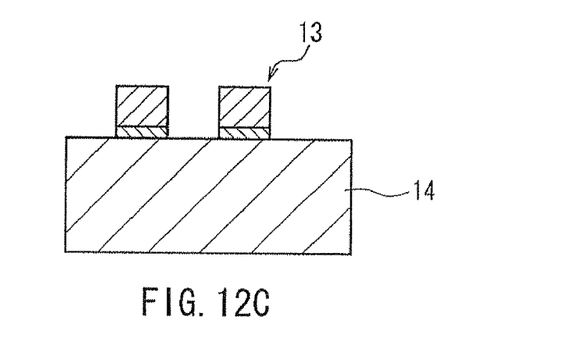
FIG. 12C is a cross-sectional diagram for describing a manufacturing step for the acoustic wave device of the embodiment.

Next, as illustrated in FIG. 12C, a photoresist for electrode patterning is formed on the Ti film 13a and the Cu film 13b, and patterning is performed using photolithography. Next, etching processing is performed on the Ti film 13a and the Cu film 13b to eliminate the photoresist, thus forming the IDT electrodes 13.

Figure 12D:
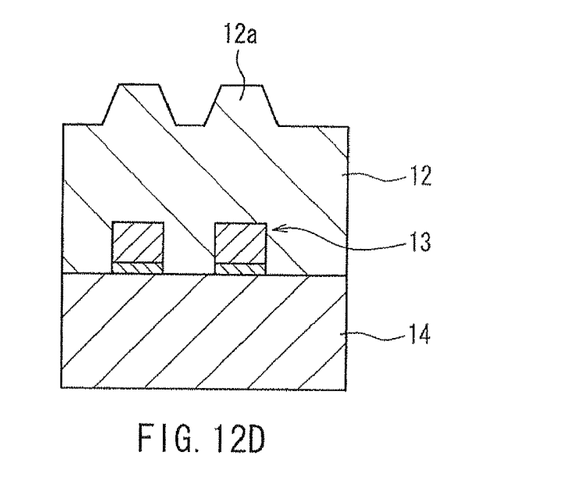
FIG. 12D is a cross-sectional diagram for describing a manufacturing step for the acoustic wave device of the embodiment.

Next, as illustrated in FIG. 12D, the $SiO_2$ film 12 is formed on the piezoelectric substrate 11 so as to cover the Ti film 13a and the Cu film 13b. In the present embodiment, the $SiO_2$ film 12 is formed by causing growth with use of a CVD method (Chemical Vapor Deposition method) until the film thickness reaches 550 nm. Projection portions 12a exist in the formed $SiO_2$ film 12 at positions over the IDT electrodes 12.

Figure 12E:
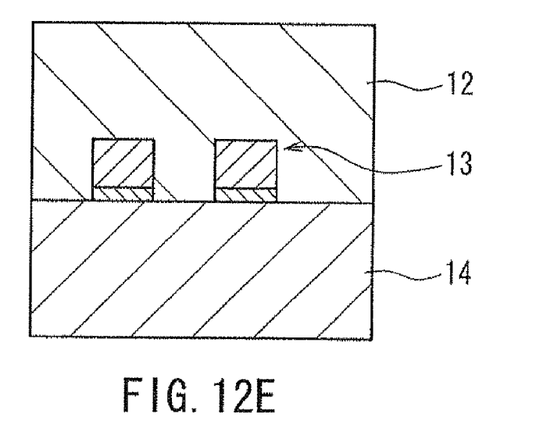
FIG. 12E is a cross-sectional diagram for describing a manufacturing step for the acoustic wave device of the embodiment.

Next, as illustrated in FIG. 12E, the surface of the $SiO_2$ film 12 is planarized by eliminating the projection portions 12a of the $SiO_2$ film 12. Note that in the present embodiment, a CMP method (Chemical Mechanical Polishing method) is used for the planarizing processing.

Figure 12F:
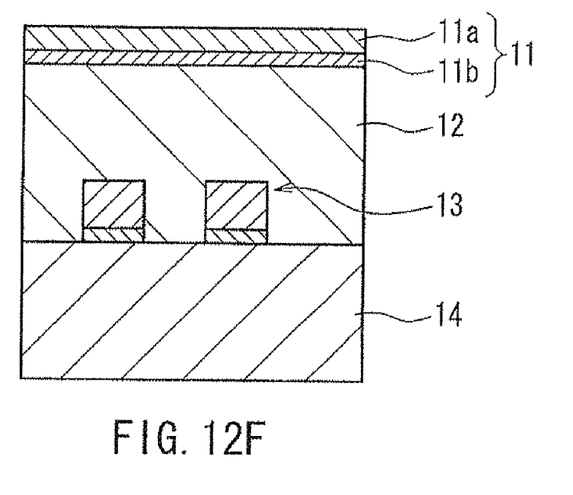
FIG. 12F is a cross-sectional diagram for describing a manufacturing step for the acoustic wave device of the embodiment.

Next, as illustrated in FIG. 12F, a Ti film 11b that is an adhesion layer is formed on the surface of the $SiO_2$ film 12, and an Au film 11a is grown on the Ti film 11b by vapor deposition processing, thus forming the displacement adjustment film 11. Note that in the present embodiment, the film thickness of the Au film 11a is 15 nm, and the film thickness of the Ti film 11b is 5 nm.

Also, if the film thickness of the $SiO_2$ film 12 is 0.3 μm or more, the influence of the potential of the displacement adjustment film 11 is small, and therefore no difference in characteristics is seen between when the displacement adjustment film 11 configured by an Au/Ti laminated film is grounded and floating. Also, even in the case of a configuration using Ag, Pt, Ta, Cu, W, Ti, WSST resist, Ni, or the like instead of Au, as illustrated in FIG. 9, manufacturing can be performed using the same manufacturing method as the present embodiment. Also, although a manufacturing method in which the displacement adjustment film 11 configured by an Au/Ti laminated film is described in the present embodiment, the same manufacturing method can be used even in the case of forming a single-layer displacement adjustment film 11.

Note that although the $SiO_2$ film 12 is a single-layer film in the present embodiment, a configuration is possible in which the $SiO_2$ film 12 has a laminated structure including a first insulating layer (e.g., an $SiO_2$ film) formed so as to have approximately the same film thickness as the IDT electrodes 13, and a second insulating layer (e.g., the same $SiO_2$ film as the first insulating layer) formed so as to cover the first insulating layer. In the manufacturing method in such a case, after the IDT electrodes 13 illustrated in FIG. 12C have been formed, the first insulating layer having approximately the same film thickness as the IDT electrodes 13 is formed between the IDT electrodes 13. At this time, the surface of the IDT electrodes 13 and the first insulating layer are approximately planar. Next, the second insulating layer is formed so as to cover the IDT electrodes 13 and the first insulating layer. By performing manufacturing in this way, the projection portions 12*a* such as those illustrated in FIG. 12D are not formed, and therefore a step for eliminating the projection portions 12*a* is not necessary. Accordingly, since polishing work is unnecessary, the manufacturing is easy and it is possible to reduce the manufacturing cost.

3. [Configuration of Communication Module]

Figure 13:
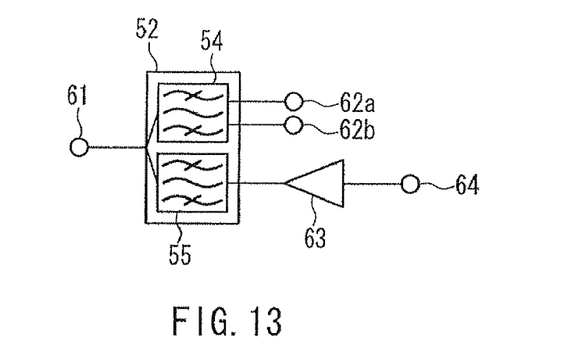
FIG. 13 is a block diagram illustrating a configuration of a communication module including the acoustic wave device of the embodiment.

FIG. 13 illustrates an example of a communication module that includes the acoustic wave device of the present embodiment. As illustrated in FIG. 13, a duplexer 52 includes a reception filter 54 and a transmission filter 55. The reception filter 54 is connected to reception terminals 62*a* and 62*b* that are compatible with, for example, balanced output. Also, the transmission filter 55 is connected to a power amplifier 63. Here, the acoustic wave device 1 of the present embodiment is included in the reception filter 54 and the transmission filter 55.

In the case of performing a reception operation, the reception filter 54 allows, among reception signals input via an antenna terminal 61, only signals in a predetermined frequency band to pass, and externally outputs such signals via the reception terminals 62*a* and 62*b*. Also, in the case of performing a transmission operation, the transmission filter 55 allows, among transmission signals input from a transmission terminal 64 and amplified by the power amplifier 63, only signals in a predetermined frequency band to pass, and externally outputs such signals via the antenna terminal 61.

Note that the configuration of the communication module illustrated in FIG. 13 is an example, and the same effects are obtained even if the acoustic wave device or duplexer of the present embodiment is mounted in a communication module having another form.

4. [Configuration of Communication Apparatus]

Figure 14:
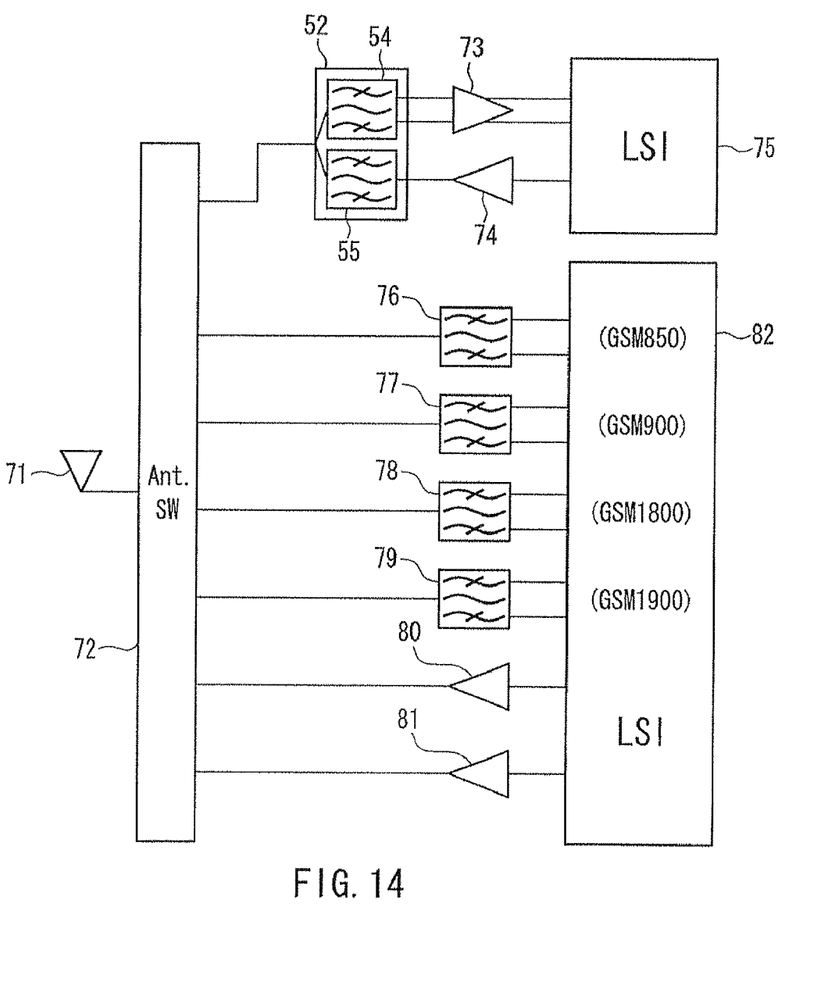
FIG. 14 is a block diagram illustrating a configuration of a communication apparatus including the acoustic wave device or the communication module of the embodiment.

FIG. 14 illustrates an RF block of a mobile phone terminal as an example of a communication apparatus including the acoustic wave device of the present embodiment. FIG. 14 illustrates a configuration of a mobile phone terminal that is compatible with the GSM (Global System for Mobile Communications) communication system and the W-CDMA (Wideband Code Division Multiple Access) communication system. Also, in the present embodiment, the GSM communication system is compatible with the 850 MHz band, the 950 MHz band, the 1.8 GHz band, and the 1.9 GHz band. Also, although the mobile phone terminal includes a microphone, a speaker, a liquid crystal display, and the like in addition to the configuration illustrated in FIG. 14, such elements are not illustrated in the figure since they are unnecessary to the description of the present embodiment. Here, the acoustic wave device 1 of the present embodiment is included in reception filters 54, 76, 77, 78, and 79, and the transmission filter 55.

First, an LSI that is targeted for operation is selected by an antenna switch circuit 72 based on whether the communication system of a reception signal input via an antenna 71 is W-CDMA or GSM. If the input reception signal is compatible with the W-CDMA communication system, switching is performed so that the reception signal is output to the duplexer 52. The reception signal input to the duplexer 52 is limited to a predetermined frequency band by the reception filter 54, and the balanced reception signal is output to an LNA 73. The LNA 73 amplifies the input reception signal, and outputs the amplified signal to an LSI 75. In the LSI 75, processing for demodulation to an audio signal is performed based on the input reception signal, and the operation of units in the mobile phone terminal is controlled.

On the other hand, in the case of transmitting a signal, the LSI 75 generates a transmission signal. The generated transmission signal is amplified by a power amplifier 74 and input to the transmission filter 55. The transmission filter 55 allows, among the input transmission signals, only signals in a predetermined frequency band to pass. The transmission signals output from the transmission filter 55 are sent to the antenna switch circuit 72 and then externally output via the antenna 71.

Also, if the input reception signal is a signal compatible with the GSM communication system, the antenna switch circuit 72 selects one of the reception filters 76 to 79 in accordance with the frequency band, and outputs the reception signal to the selected reception filter. The band of the reception signal is limited by the selected one of the reception filters 76 to 79, and the resulting signal is input to an LSI 82. The LSI 82 performs processing for demodulation to an audio signal based on the input reception signal, and controls the operation of units in the mobile phone terminal. On the other hand, in the case of transmitting a signal, the LSI 82 generates a transmission signal. The generated transmission signal is amplified by a power amplifier 80 or 81, sent to the antenna switch circuit 72, and externally output via the antenna 71.

5. [Effects of the Embodiment and Other Remarks]

According to the present embodiment, by forming, on the $SiO_2$ film 12, the displacement adjustment film 11 configured from a substance whose acoustic velocity is slower than that of the substance forming the $SiO_2$ film 12, it is possible to suppress the generation of unnecessary waves and also improve the TCF. This enables realizing an acoustic wave device, a communication module, and a communication apparatus that are highly reliable.

Note that although a mobile phone terminal, a PHS terminal, and the like are given as examples of communication apparatuses to which the acoustic wave device of the present embodiment or a communication module including the acoustic wave device of the present embodiment can be applied, there is no limitation to such communication apparatuses.

The present application is useful to an acoustic wave device such as a SAW (Surface Acoustic Wave) device, which is an example of a device in which acoustic waves are applied. Also, the present application is useful to a communication module and communication device that include such an acoustic wave device.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the sprit and scope of the invention.

The invention claimed is:

1. A surface acoustic wave device provided with a piezoelectric substrate,
    interdigital transducer electrodes formed on the piezoelectric substrate, and
    an insulating layer formed so as to cover the electrodes,
    the surface acoustic wave device comprising:
        a displacement adjustment film including an adhesion layer formed on the insulating layer,
        wherein the displacement adjustment film is formed from a substance which acoustic velocity is slower than that of a substance forming the insulating layer,
        a surface of the insulating layer in contact with the displacement adjustment film is planar, and
        the adhesion layer is formed at a portion contacting the insulating layer.

2. The surface acoustic wave device according to claim 1, wherein the electrodes are configured by a metal, an alloy whose main component is the metal, or a laminated film configured from a metal and another metal.

3. The surface acoustic wave device according to claim 2, wherein the insulating layer is formed from $SiO_2$, and the displacement adjustment film is formed from a single-layer film made of a substance whose acoustic velocity is slower than that of $SiO_2$, or a laminated film whose main component is any substance from among substances whose acoustic velocity is slower than that of $SiO_2$.

4. The surface acoustic wave device according to claim 3, wherein the displacement adjustment film is formed from a single-layer film made of any of Au, Ag, Pt, Ta, Cu, W, Ti, and Ni, or a laminated film whose main component is any substance from among Au, Ag, Pt, Ta, Cu, W, Ti, and Ni.

5. A manufacturing method for a surface acoustic wave device provided with a piezoelectric substrate, interdigital transducer electrodes an insulating layer, and a displacement adjustment film configured by a substance which acoustic velocity is slower than that of the insulating layer, the manufacturing method comprising:
    forming the electrodes on the piezoelectric substrate;
    forming the insulating layer on the piezoelectric substrate so as to cover the electrodes;
    flattening a surface of the insulating layer; and
    forming the displacement adjustment film including an adhesion layer on the surface of the insulating layer;
    wherein the adhesion layer is formed on the surface of the insulating layer.

6. A communication module comprising the surface acoustic wave device, the surface acoustic wave device comprising:
    a piezoelectric substrate,
    interdigital transducer electrodes formed on the piezoelectric substrate,
    an insulating layer formed so as to cover the electrodes, and
    a displacement adjustment film including an adhesion layer formed on the insulating layer,
    wherein the displacement adjustment film is formed from a substance whose acoustic velocity is slower than that of a substance forming the insulating layer,
    a surface of the insulating layer in contact with the displacement adjustment film is planar, and
    the adhesion layer is formed at a portion contacting the insulating layer.

7. A communication apparatus comprising the surface acoustic wave device, the surface acoustic wave device comprising:
    a piezoelectric substrate,
    interdigital transducer electrodes formed on the piezoelectric substrate,
    an insulating layer formed so as to cover the electrodes, and
    a displacement adjustment film including an adhesion layer formed on the insulating layer,
    wherein the displacement adjustment film is formed from a substance whose acoustic velocity is slower than that of a substance forming the insulating layer,
    a surface of the insulating layer in contact with the displacement adjustment film is planar, and
    the adhesion layer is formed at a portion contacting the insulating layer.

* * * * *